(12) United States Patent
Freytsis et al.

(10) Patent No.: US 7,608,843 B2
(45) Date of Patent: Oct. 27, 2009

(54) METHOD AND APPARATUS FOR SCANNING A WORKPIECE THROUGH AN ION BEAM

(75) Inventors: Avrum Freytsis, Salem, MA (US); Matthew C. Gwinn, Winchendon, MA (US); Eric R. Harrington, Topsfield, MA (US)

(73) Assignee: TEL Epion Inc., Billerica, MA (US)

( * ) Notice: Subject to any disclaimer, the term of this patent is extended or adjusted under 35 U.S.C. 154(b) by 144 days.

(21) Appl. No.: 11/565,267

(22) Filed: Nov. 30, 2006

(65) Prior Publication Data

US 2007/0262267 A1 Nov. 15, 2007

Related U.S. Application Data

(60) Provisional application No. 60/741,521, filed on Dec. 1, 2005.

(51) Int. Cl.
*H01J 37/08* (2006.01)
(52) U.S. Cl. ............ 250/492.2; 250/492.1; 250/492.21; 250/492.3; 250/453.11; 250/442.11
(58) Field of Classification Search ............... 250/492.1, 250/492.2, 492.21, 492.3, 453.11, 442.11; 285/114; 212/283; 414/805, 744.3, 800, 414/21
See application file for complete search history.

(56) References Cited

U.S. PATENT DOCUMENTS

| | | | | |
|---|---|---|---|---|
| 4,733,091 A | * | 3/1988 | Robinson et al. | 250/492.2 |
| 4,965,862 A | * | 10/1990 | Freytsis et al. | 250/453.11 |
| 5,003,183 A | | 3/1991 | Nogami et al. | |
| 5,789,890 A | * | 8/1998 | Genov et al. | 318/567 |
| 5,814,194 A | | 9/1998 | Deguchi et al. | |
| 6,241,462 B1 | * | 6/2001 | Wannasuphoprasit et al. | 414/800 |
| 6,486,478 B1 | * | 11/2002 | Libby et al. | 250/492.1 |
| 6,494,666 B2 | * | 12/2002 | Wu et al. | 414/744.3 |
| 6,646,277 B2 | | 11/2003 | Mack et al. | |
| 7,067,828 B2 | | 6/2006 | Swenson | |
| 7,105,838 B2 | * | 9/2006 | Naylor-Smith et al. | 250/492.21 |
| 7,119,343 B2 | * | 10/2006 | Asdigha et al. | 250/442.11 |
| 7,326,941 B2 | * | 2/2008 | Chen et al. | 250/492.21 |
| 2002/0134950 A1 | * | 9/2002 | Vanderpot et al. | 250/492.21 |
| 2003/0094583 A1 | * | 5/2003 | Jang et al. | 250/492.21 |

(Continued)

OTHER PUBLICATIONS

PCTUS0661424, publication date: Apr. 10, 2008, Written Opinion.

*Primary Examiner*—David A Vanore
*Assistant Examiner*—Michael Maskell
(74) *Attorney, Agent, or Firm*—Burns & Levinson LLP; David Gomes; Jerry Cohen

(57) ABSTRACT

A method and apparatus 300 for better controlling scanning of a workpiece 330 through an ion beam path 306 provide for mounting a workpiece 330 on an elongated member, partially repetitively rotating the elongated member 500 around a point of rotation 368 to make repetitive scans of the workpiece 330 along and arcuate path 504 and bending the elongated member 500 at a joint 322 to move the one and out of the ion beam path 306 to facilitate attachment and removal of individual workpieces 330. A motor 315 used for the rotating may be suspended within a partial vacuum enclosure 304 against gravity for raising and lowering the elongated member and 500 a workpiece 306 for linear vertical scanning.

25 Claims, 10 Drawing Sheets

U.S. PATENT DOCUMENTS

| | | | |
|---|---|---|---|
| 2004/0222390 A1* | 11/2004 | Ferrara et al. | 250/492.21 |
| 2005/0173656 A1* | 8/2005 | Kaim et al. | 250/492.21 |
| 2005/0184253 A1* | 8/2005 | Ioannou et al. | 250/492.21 |
| 2005/0230643 A1 | 10/2005 | Vanderpot et al. | |
| 2005/0232748 A1 | 10/2005 | Vanderpot et al. | |
| 2005/0232749 A1* | 10/2005 | Vanderpot et al. | 414/805 |

* cited by examiner

METHOD AND APPARATUS FOR SCANNING A WORKPIECE THROUGH AN ION BEAM

RELATED APPLICATIONS

The present application claims priority from Provisional U.S. Patent Application Ser. No. 60/741,521, filed Dec. 1, 2005, the contents of which are hereby incorporated by reference herein.

FIELD OF THE INVENTION

This invention relates generally to methods and apparatus for scanning workpieces through an ion beam for beam processing, and, more particularly, to methods and apparatus for high speed mechanical scanning to achieve improved processing times.

BACKGROUND OF THE INVENTION

The use of a cluster ion beam for processing surfaces is known (see for example, U.S. Pat. No. 5,814,194, Deguchi et al.) in the art. In this description, gas-clusters are defined as nano-sized aggregates of materials that would be gaseous under conditions of standard temperature and pressure. Such gas-clusters typically consist of aggregates of from a few to several thousand molecules loosely bound to form the cluster. The clusters can be ionized by electron bombardment or other means, permitting them to be formed into directed beams having controllable energy. Such ions each typically carry positive charges of $q \cdot e$ (where e is the electronic charge and q is an integer of from one to several representing the charge state of the cluster ion). Non-ionized clusters may also exist within a cluster ion beam. The larger sized cluster ions are often the most useful because of their ability to carry substantial energy per cluster ion, while yet having only modest energy per molecule. The clusters disintegrate on impact, with each individual molecule carrying only a small fraction of the total cluster ion energy. Consequently, the impact effects of large cluster ions are substantial, but are limited to a very shallow surface region. This makes cluster ions effective for a variety of surface modification processes, without the tendency to produce deeper subsurface damage characteristic of conventional monomer ion beam processing.

Means for creation of and acceleration of a gas-cluster ion beam (GCIB) are described in the reference (U.S. Pat. No. 5,814,194) previously cited. Presently available cluster ion sources produce cluster ions having a wide distribution of sizes, N (where N=the number of molecules in each cluster ion—in the case of monatomic gases like argon, an atom of the monatomic gas will be referred to as a molecule and an ionized atom of such a monatomic gas will be referred to as a molecular ion—or simply a monomer ion—throughout this discussion).

Many useful surface-processing effects can be achieved by bombarding surfaces with GCIBs. These processing effects include, but are not necessarily limited to, cleaning, smoothing, etching, doping, and film formation or growth.

In processing workpieces with a gas-cluster ion beam, it is generally desirable to use a scanning technique to provide for uniform processing of workpieces that are larger than the GCIB cross section. In the prior art, electrostatic beam scanning has sometimes been employed to scan GCIBs across a workpiece. As the available GCIB currents have increased with improved beam generation techniques, electrostatic scanners have become less practical and it has become customary to mechanically scan the workpiece through a stationary GCIB to achieve uniform processing of large workpieces. In such cases, a workpiece (often, but not necessarily a semiconductor wafer) has been held in a holder attached to an X-Y scanning platform. These X-Y mechanical scanners have been effective for uniformly processing workpieces in ion beams. In order to achieve uniform processing, it is desirable to scan the workpiece in a raster or other pattern that forms a complete treatment pattern on the workpiece by the ion beam and wherein the pitch of the scanned pattern is fine compared to the size of the ion beam or compared to any non-uniformity of the spatial intensity of the incident ion beam spot on the workpiece. Additionally, uniformity is improved if multiple, complete scans of the workpiece are performed, thus compensating for small temporal variations in the ion beam intensity. Thus it is desirable to be able to perform rapid scanning of the workpiece in order to quickly achieve complete coverage, and if required, multiple complete scans. However, existing X-Y mechanical scan mechanisms have been relatively slow moving due to the practical difficulties involved in rapidly accelerating the masses involved. Furthermore, attempts to speed the motion by brute force techniques results in transmission of excessive vibration to the supporting members of the frame of the ion beam processing equipment, often resulting in creation of reliability problems and/or other practical problems.

Published US Patent Applications US2005/0230643A1, US2005/0232748A1, and US2005/0232749A1 all due to Vanderpot et al. describe methods and apparatus for scanning or reciprocating workpieces through an ion beam using a novel counter-rotating stator motor design for reducing transmitted vibration, while providing high scan velocities and accelerations in an arcuate scanning path. The entire contents of US2005/0230643A1, US2005/0232748A1, and US2005/0232749A1 are hereby incorporated herein by reference.

As it is often more practical to generate a GCIB processing beam along a horizontal or near horizontal trajectory, it is desirable to process workpieces such as semiconductor wafers such that the workpiece surface is in a vertical plane (and thus intercepting the ion beam at a direction approximately normal to the surface being processed) during processing. On the other hand, flat workpieces such as semiconductor wafers are often transported in standardized containers in which the workpieces are held so that their flat surfaces are substantially in a horizontal plane. It is often easier and more reliable (or otherwise desirable) to remove flat workpieces from their transport containers for loading onto a holder for processing in an ion beam by using robotic or automated handling systems that move the workpieces while maintaining them in a substantially horizontal orientation.

It is therefore an objective of this invention to provide a method for and apparatus for rapidly scanning a workpiece through an ion beam for uniform processing.

It is another objective of this invention to provide a method for and apparatus for rapidly scanning a workpiece through an ion beam, with reduced transmission of vibrations to the scanner supporting members of the GCIB processing equipment and to other portions of the GCIB processing equipment.

It is a further objective of this invention to provide methods and apparatus for horizontal loading and unloading of the workpiece onto the scanner workpiece holder, while permitting vertical orientation of the workpiece during ion beam processing.

SUMMARY OF THE INVENTION

In one embodiment, a method for scanning a workpiece through an ion beam path, comprises the steps of mounting a workpiece within an ion beam path at one end of an elongated member; partially, repetitively rotating the elongated member around a point of rotation on the elongated member and away from the workpiece to make repetitive scans of the workpiece through the ion beam path along an arcuate path; and bending the elongated member at a joint located between the one end and the point of rotation to move the one end out of the ion beam path to facilitate attachment and removal of individual workpieces at the one end.

The workpiece may be a semiconductor substrate, and the step of bending the elongated member moves the workpiece to a substantially horizontal position. The method may further comprise the steps of maintaining a partial vacuum within an enclosure located around the elongated member; and attaching and removing individual workpieces at the one end through a closable opening in the enclosure while the elongated member is bent and the workpieces are handled in a substantially horizontal position.

The step of partially, repetitively rotating may use an electric motor with the elongated member mounted thereto, and the method may further comprise the step of maintaining a partial vacuum within an enclosure located around the elongated member and the electric motor. The method may further comprise the step of moving the elongated member upwardly or downwardly to cause different portions of the workpiece to pass through the ion beam path during the repetitive scans, wherein the step of moving the elongated member includes suspending the electric motor and elongated member against gravity and thereby raising and lowering the electric motor and elongated member. The method may still further comprise the step of guiding the raising and lowering of the suspended electric motor and elongated member within the enclosure. The step of partially, repetitively rotating the elongated member may use an electric motor having a rotating stator adapted to act as a reaction mass to a rotor.

The step of bending may include the steps of mechanically biasing the elongated member towards a first position wherein the one end is extended to intersect the ion beam path; engaging a portion of the elongated member between the one end and the joint; and alternatively using the step of moving to bend the elongated member against the mechanical biasing during the step of engaging the portion of the elongated member. The step of mounting may use an electrostatic chuck for holding a semiconductor workpiece or other substantially planar workpiece.

In another embodiment, an apparatus for scanning a workpiece through an ion beam path, comprises an elongated member adapted to mount a workpiece within an ion beam path at one end of the elongated member; and a rotational mechanism mounting the elongated member at a point of rotation located on the elongated member away from the one end and further adapted to repetitively scan a workpiece mounted on the one end through the ion beam path along an arcuate path by partial repetitive rotation of the rotational mechanism and the elongated member, wherein the elongated member includes a joint located between the one end and the point of rotation and adapted to allow bending of the elongated member to move the one end out of the ion beam path to facilitate attachment and removal of individual workpieces at the one end.

The elongated member may be adapted to orient planar workpieces in a substantially horizontal position when the elongated member is bent. The apparatus may further comprise an enclosure located around the elongated member and any workpiece mounted to the one end and adapted to maintain a partial vacuum therein, wherein the enclosure includes a closable opening adapted to facilitate attachment and removal of individual workpieces at the one end of the elongated member in the substantially horizontal position.

The apparatus may still further comprise an enclosure located around the elongated member and the rotational mechanism and adapted to maintain a partial vacuum therein; a mechanism suspending the elongated member and rotational mechanism against gravity within the enclosure and adapted to cause linear movement of the rotational mechanism and the elongated member upwardly and downwardly to cause different portions of a workpiece mounted on the one end to pass through the ion beam path during repetitive scans.

The apparatus may yet further comprise one or more guiding members affixed within the enclosure and adapted for guiding the raising and lowering of the suspended rotational mechanism. The mechanism suspending the elongated member and the rotational mechanism may include a flexible tensile member and a rotatable drum, wherein the flexible tensile member is attached to the rotational mechanism and adapted to wrap around the drum to allow rotation of the drum to raise and lower the rotational mechanism and elongated member. The apparatus may even further comprise an electric motor preferably positioned outside of the enclosure and adapted to control rotation of the drum.

The elongated member may include an electrostatic chuck located at the one end and adapted it for mounting the workpiece to the elongated member. The rotational mechanism may include an electric motor having a rotating stator adapted to act as a reaction mass to a rotor.

The apparatus may further comprise a bias mechanism adapted to bias the elongated member around the joint to an extended position of the one end positioned within the ion beam path; and an engagement mechanism adapted to selectively engage a portion of the elongated member between the one end and the joint, wherein the selectively engageable portion of the elongated member is adapted to cause bending of the elongated member at the joint in response to the linear movement of the elongated member when selectively engaged by the engagement mechanism.

In still another embodiment, and apparatus for scanning a workpiece through an ion beam path, comprises an elongated member adapted to mount a workpiece within an ion beam path at one end of the elongated member; a rotational mechanism mounting the elongated member at a point of rotation located on the elongated member away from the one end and further adapted to repetitively scan a workpiece mounted on the one end through the ion beam path along an arcuate path by partial repetitive rotation of the rotational mechanism and the elongated member; an enclosure located around the elongated member and the rotational mechanism and adapted to maintain a partial vacuum therein; and a mechanism suspending the elongated member and rotational mechanism against gravity within the enclosure and adapted to cause linear movement of the rotational mechanism and the elongated member upwardly and downwardly to cause different portions of a workpiece mounted on the one end to pass through the ion beam path during repetitive scans.

The rotational mechanism may include an electric motor having a rotating stator adapted to act as a reaction mass to a rotor. The mechanism suspending the elongated member and the rotational mechanism may include a flexible tensile member and a rotatable drum, and the flexible tensile member may be attached at opposite ends to the rotational mechanism and to the drum and adapted to wrap around the drum to allow rotation of the drum to raise and lower the rotational mechanism and elongated member. The apparatus may further comprise an electric motor that may preferably be positioned outside of the enclosure and adapted to control rotation of the drum.

In still another embodiment, a method for scanning a workpiece through an ion beam path, comprises the steps of mounting a workpiece within an ion beam path at one end of an elongated member; partially, repetitively rotating the elongated member around a point of rotation on the elongated member and away from the workpiece with an electric motor mounting the elongated member to make repetitive scans of the workpiece through the ion beam path along an arcuate path; maintaining a partial vacuum within an enclosure located around the elongated member and the electric motor; and moving the elongated member upwardly or downwardly to cause different portions of the workpiece to pass through the ion beam path during the repetitive scans, wherein the step of moving the elongated member includes suspending the electric motor and elongated member against gravity and thereby raising and lowering the electric motor and elongated member.

The step of moving the elongated member may include the step of rotating a drum attached to the electric motor by a flexible tensile member with one end of the flexible tensile member adapted to wrap around the drum with rotation thereof. The step of partially, repetitively rotating the elongated member may use an electric motor having a rotating stator adapted to act as a reaction mass to a rotor.

BRIEF DESCRIPTION OF THE FIGURES

For a better understanding of the present invention, together with other and further objects thereof, reference is made to the accompanying drawings and detailed description, wherein.

DETAILED DESCRIPTION OF THE FIGURES

Figure 1:
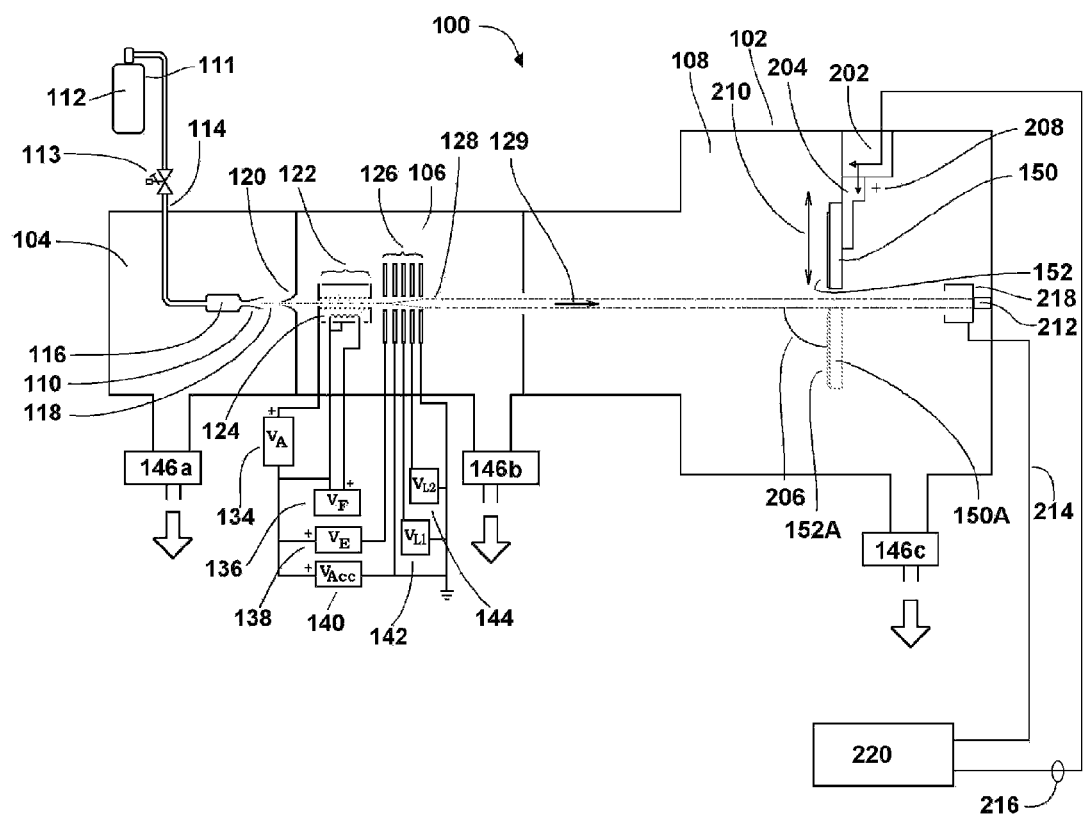
FIG. 1 is a schematic showing the basic elements of a prior art GCIB processing apparatus.

FIG. 1 shows a schematic of the basic elements of a typical configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases and/or gas mixtures.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion of the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2:
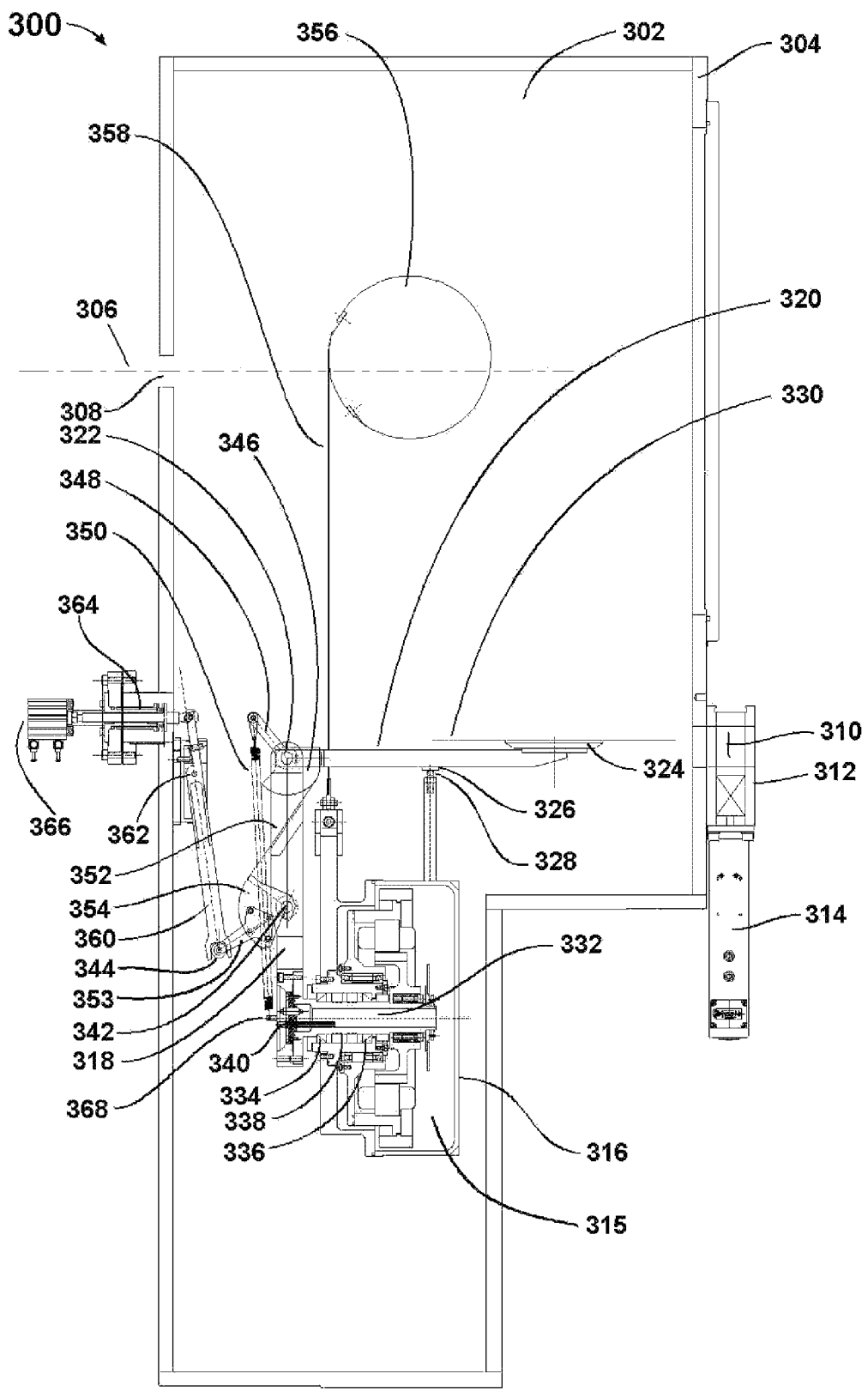
FIG. 2 shows a schematic of a processing chamber 300 of a GCIB processing apparatus utilizing a workpiece scanner according to an embodiment of the present invention, and wherein the workpiece holder of the scanner is shown in a workpiece load/unload position.

FIG. 2 shows a side view schematic of a processing chamber 300 of a GCIB processing apparatus utilizing a workpiece scanner according to an embodiment of the present invention. The processing chamber 302 is enclosed in a processing chamber wall 304 that forms a barrier enclosing the vacuum region inside the chamber and separating the normal atmosphere outside the chamber. The processing chamber 302 has a beam opening 308, that communicates with a beam generating system (not shown) through which a GCIB can be directed into the processing chamber 302 along a beam axis 306. The processing chamber wall 304 also has a workpiece transfer opening 310 that communicates with an attached workpiece load lock (not shown) that is a vacuum lock (capable of operation at vacuum or atmospheric pressure) to permit transferring workpieces from outside the vacuum in the processing chamber 302 to the interior of the processing chamber 302. The transfer opening 310 has a gate valve 312 with a gate valve actuator 314 for opening and closing the gate valve 312 in order to seal or unseal the workpiece transfer opening 310, thus permitting vacuum-to-vacuum transfer of workpieces (when unsealed) and operating the attached workpiece load lock at atmospheric pressure (when sealed) permitting atmosphere-to-atmosphere transfer of workpieces into the load lock.

The processing chamber 302 encloses a mechanical scan system according to the present invention. A hermetically sealed scan motor enclosure 316, the interior of which may operate at atmospheric pressure and which encloses a rotary scan motor 315 driving a shaft 332 that passes through a (preferably) ferrofluidic rotary feedthrough seal 338. The shaft 332 is supported by rotary bearings 334 and 336. The end of the shaft 332 that is outside of the hermetically sealed scan motor enclosure 316 has a hub 340 for attaching a scan arm that comprises a lower scan arm 318 connected to an upper scan arm 320 by a pivoting joint 322. As illustrated in FIG. 2, the upper scan arm 320 is pivoted at pivoting joint 322 so as to place the upper scan arm 320 in a horizontal position suitable for loading and unloading workpieces. The upper scan arm 320 attaches a workpiece holder 324, preferably an electrostatic wafer chuck for holding a workpiece 330, typically (but not necessarily) a semiconductor wafer. The workpiece is held from the backside, with the opposite side unobstructed by the holder and thus exposed for ion beam processing. Any suitable type of workpiece holder may be used, such as the preferred electrostatic wafer chuck or a mechanical holder.

When the rotary scan motor 315 controllably positions the shaft 332 and hub 340 such that the lower scan arm 318 is vertical (toward the top of the FIG. 2) and the upper scan arm 320 is pivoted at the pivoting joint 322, a strike point 326 on the upper scan arm 320 can rest on an adjustable stop 328, aligned so that the workpiece holder 324 and any held workpiece 330 are horizontally aligned with the workpiece transfer opening 310. With the workpiece holder 324 and any workpiece 330 thus aligned, transfer of the workpiece 330 out of (or into) the processing chamber 302 through the workpiece transfer opening 310 is facilitated as will be described hereinafter at the description of FIGS. 6 and 7.

A vertical drive drum 356 can be driven in a rotary motion as will be described more fully hereinbelow. The vertical drive drum 356 has attached a flexible tensile member 358 that is for example a stainless steel cable or (preferably) a stainless steel foil strap. The scanning assembly comprising the rotary scan motor 315, the scan motor enclosure 316, the upper and lower scan arms 320 and 318 respectively, and the workpiece holder 324 is constrained to move in a vertical direction by one or more linear bearings (not shown) attached to the scan motor enclosure 316 and to the processing chamber enclosure 304 wall and is suspended vertically by the flexible tensile member 358. When the vertical drive drum 356 rotates, the scanning assembly (comprising 315, 316, 320, 318, and 324) moves vertically up or down according to the rotation of the vertical drive drum 356.

The upper scan arm 320 has a pivoting motion with respect to the lower scan arm 318 at the pivoting joint 322 that may be controlled as follows. A linear actuator 366, preferably a solenoid or a linear pneumatic actuator transmits a controllable linear motion into the processing chamber 302 through a linear vacuum feedthrough 364 (preferably a metallic bellows). The linear actuator 366 connects to one end of a pivoting cam actuating lever 360. The cam actuating lever 360 has a fixed pivot point 362 so that the end of the cam actuating lever 360 that is distal to the end connected to the linear actuator 366 moves pivotally in response to the linear actuator 366.

A lower cam 354 is attached rotatably to the lower scan arm 318 at a lower cam pivot 342. A second flexible tensile member 352 that is for example a stainless steel cable or (preferably) a stainless steel foil strap attaches to the lower cam 354 and to an upper cam 346. Upper cam 346 is attached to the upper scan arm 320 at the pivoting joint 322. A lever arm 348 also attaches to the upper scan arm 320 at the pivoting joint 322. A tension spring 350, which may comprise multiple springs, attaches to the lever arm 348. The opposite end of spring 350 attaches to a fixed anchor point 368 on the lower scan arm 318 at a point near the hub 340.

When the linear actuator 366 is controllably retracted, it pulls the attached end of the cam actuating lever 360, causing the distal end of the cam actuating lever 360 to pivot away from the process chamber wall into a position where it can engage a cam actuating roller 344 at the end of a lower lever arm 353 rigidly attached to lower cam 354. When the rotary scan motor 315 is controlled to position the shaft 332 and hub 340 such that the lower scan arm 318 is vertical, and then as the vertical drive drum 356 is controllably rotated to lift the scanning assembly (comprising 315, 316, 320, 318, and 324) from an initially lower position, the cam actuating lever 360 engages the cam actuating roller 344. As the vertical drive drum 356 is further rotated, lifting the scanning assembly, the lower lever arm 353 is depressed relative to the rising lower scan arm 318 by the cam actuating lever 360, causing it to rotate the lower cam 354 and via the second flexible tensile member 352 to induce a counter rotation in upper cam 346 that causes the upper scan arm 320 to lower or bend from an initially vertical position toward its horizontal position (as shown in FIG. 2).

Figure 3:
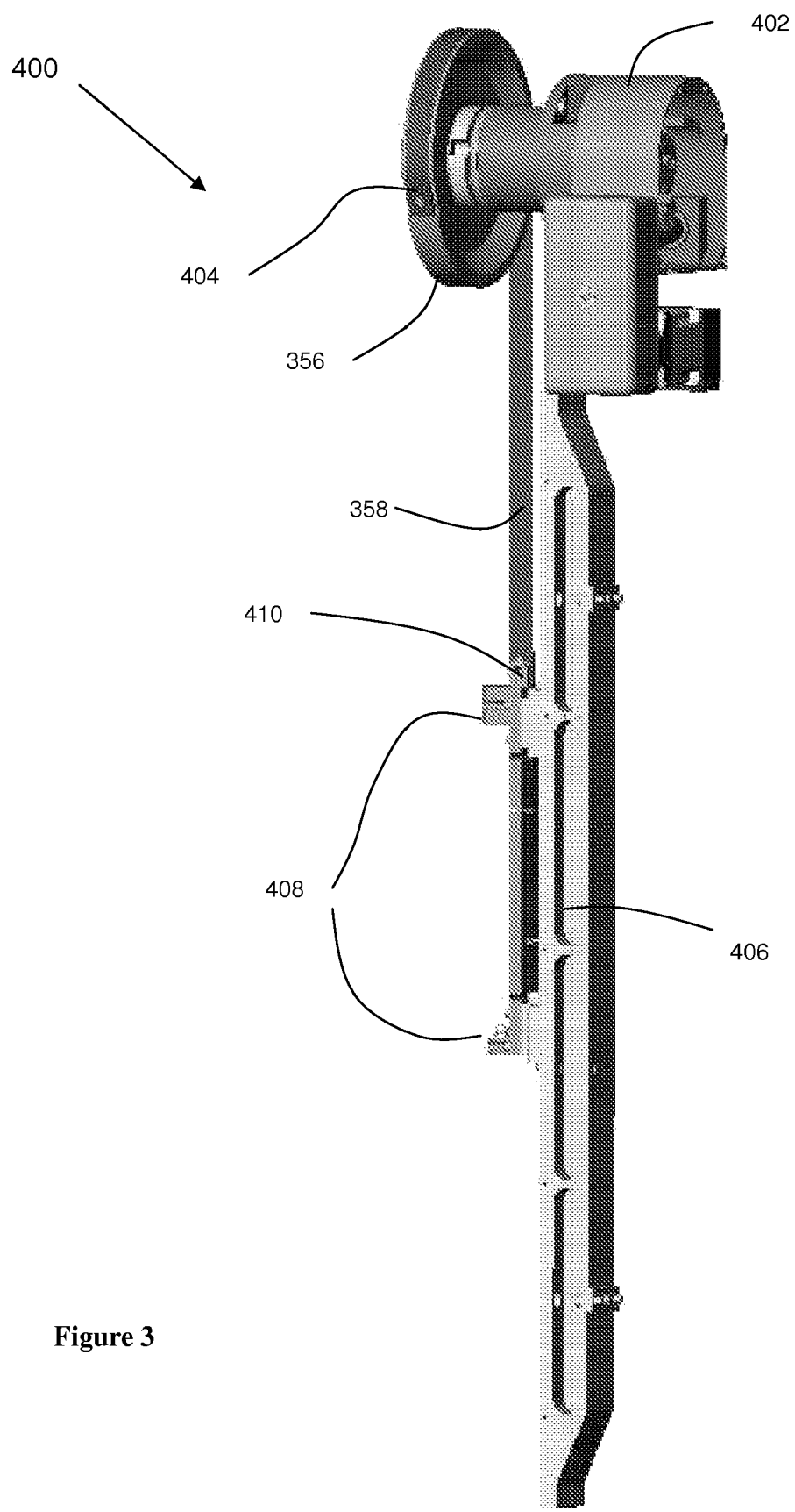
FIG. 3 shows a detail view of a vertical scan motion drive system 400 of a GCIB processing apparatus according to an embodiment of the present invention.

FIG. 3 shows a detail view of the vertical scan motion drive system 400 of a GCIB processing apparatus according to an embodiment of the present invention. A vertical scan motor 402 controllably rotates the vertical drive drum 356. The vertical drive drum 356 has an attachment point 404 at which is attached a flexible tensile member 358, preferably a stainless steel foil strap. The flexible tensile member 358 also attaches at an attachment point 410 to a carriage with two connectors 408 that attach to the scan motor enclosure 316 (shown in FIG. 2). The carriage rides on a linear bearing 406 that (together with other linear bearings and guides not shown) constrains the motion of the carriage and attached scan motor enclosure 316 to a linear vertical motion controlled by the rotation of the vertical scan motor 402 and the force of gravity, which may optionally be augmented by a spring or other biasing force, not shown. Optionally, an opposed guide or bearing (not shown) located on the an opposed enclosure wall (not shown) may be used to stabilize the scan assembly during various steps of the entire process. The vertical scan motor 402 serves to controllably and reversibly scan the scanning assembly (comprising 315, 316, 320, 318, and 324 shown in FIG. 2) up or down as required for workpiece scanning and to move the scanning assembly up or down to control the pivoting action of the upper scan arm 320 (shown in FIG. 2) in moving between the workpiece loading/unloading position shown in FIG. 2 and the scanning position shown in FIG. 5.

Figure 4:
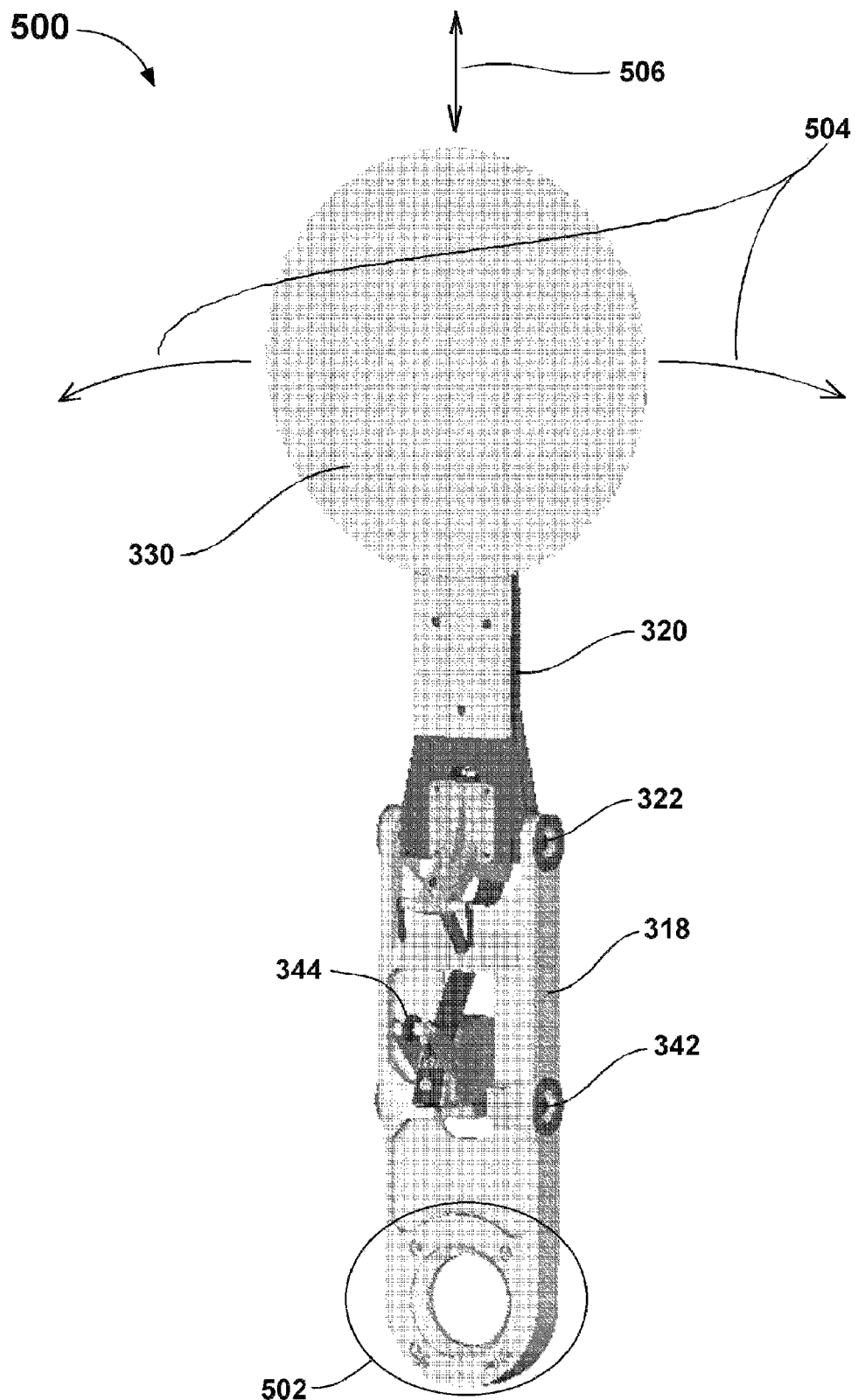
FIG. 4 shows a detail view of a scan arm 500, holding a workpiece, according to an embodiment of the present invention.

FIG. 4 shows a detail view of the scan arm 500, holding a workpiece 330, according to an embodiment of the present invention. The scan arm 500, comprises an upper scan arm 320, attached by a pivoting joint 322 to a lower scan arm 318. The lower end of the scan arm 500 has attachment holes 502 for attaching to the hub 340 of the rotary scan motor 315 (340 and 315 shown in FIG. 2) thereby defining a point of rotation for scan arm 500. The upper scan arm 320 has a workpiece holder 324 (hidden in FIG. 4, but visible in FIG. 2) that holds a workpiece 330. The rotary scan motor 315 (FIG. 2) can controllably oscillate the scan arm 500 and the workpiece 330 in a reversible arcuate scan motion 504. The vertical scan motor 402 (shown in FIG. 3) can controllably oscillate the scan arm 500 and the workpiece in a reversible vertical scan motion 506. Also shown in FIG. 4 are various details of scan arm 500 that were identified and discussed in reference to FIG. 2.

Figure 5:
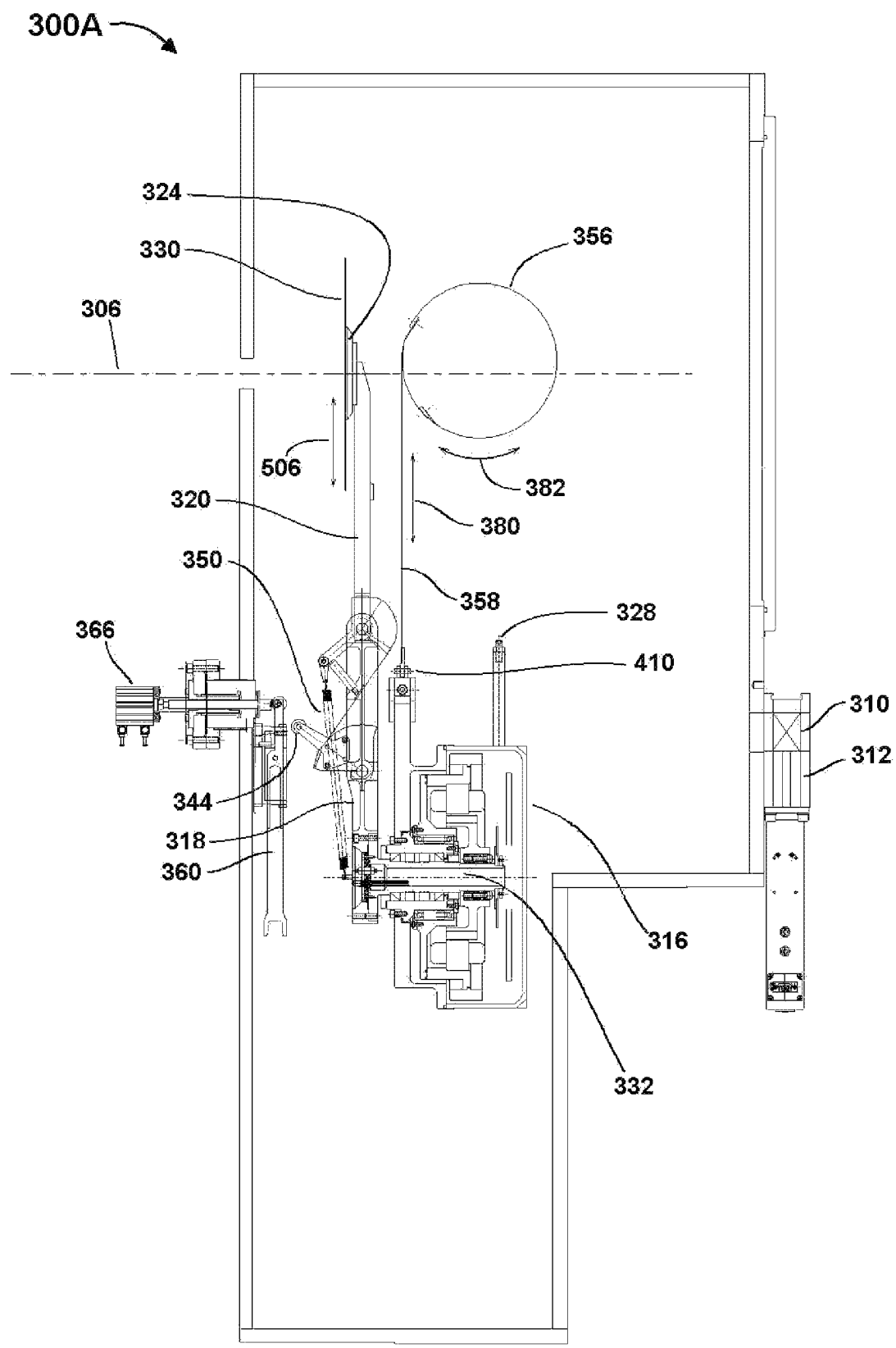
FIG. 5 shows a schematic of a processing chamber 300A of a GCIB processing apparatus utilizing a workpiece scanner according to an embodiment of the present invention, and wherein the workpiece holder of the scanner is shown in a workpiece processing position.

FIG. 5 shows a schematic of a processing chamber 300A of a GCIB processing apparatus utilizing a workpiece scanner according to an embodiment of the present invention, and wherein the workpiece holder of the scanner is shown in a workpiece processing position. Starting at the workpiece loading/unloading position illustrated in FIG. 2, the workpiece processing position illustrated in FIG. 5 is achieved by utilizing the vertical scan motor 402 (shown in FIG. 3) to lower the entire scanning assembly (comprising 315, 316, 320, 318, and 324, all shown in FIG. 2). First the workpiece transfer opening 310 may be closed by gate valve 312 to isolate the evacuated processing chamber 302 from the load lock (not shown). The scanning assembly lowering action first causes the lower cam 354 (FIG. 2) and the upper cam 346 (FIG. 2) to rotate, pivoting the upper scan arm 320 from the loading/unloading position illustrated in FIG. 2 to the vertical, processing position illustrated in FIG. 5, due to the action of the spring 350. When the upper scan arm 320 has reached its vertical position, further lowering of the scanning assembly by vertical scan motor 402 causes the cam actuating roller 344 to disengage from the cam actuating lever 360. By then controllably switching the linear actuator 366 from its retracted position (shown in FIG. 2) to its extended position (shown in FIG. 5), the cam actuating lever 360 is thus removed from the position where it can engage the cam actuating roller 344, and the scanning assembly is free to move up and down in a vertical scan motion 506 under the control of the vertical scan motor 402 (FIG. 3). By controlled, coordinated movement of the vertical scan motor 402 (FIG. 3) and the rotary scan motor 315 (FIG. 2), the workpiece 330 held by the workpiece holder 324 is controllably scanned through the ion beam axis 306 to provide beam processing over the full surface of the workpiece 330. In general it is desirable that the vertical scan motion 506 be relatively slower than the rotary arcuate scan motion 504 (FIG. 4) to produce a raster-like scanning pattern of the incident spot of the ion beam on the workpiece 330. Oscillatory rotary motion of the vertical scan motor 402 (FIG. 3) results in the corresponding oscillatory rotary motion 382 of the vertical drive drum 356, which in turn produces an oscillatory linear motion 380 in the flexible tensile member 358 producing a corresponding vertical scan motion 506 at the workpiece 330.

Figure 6:
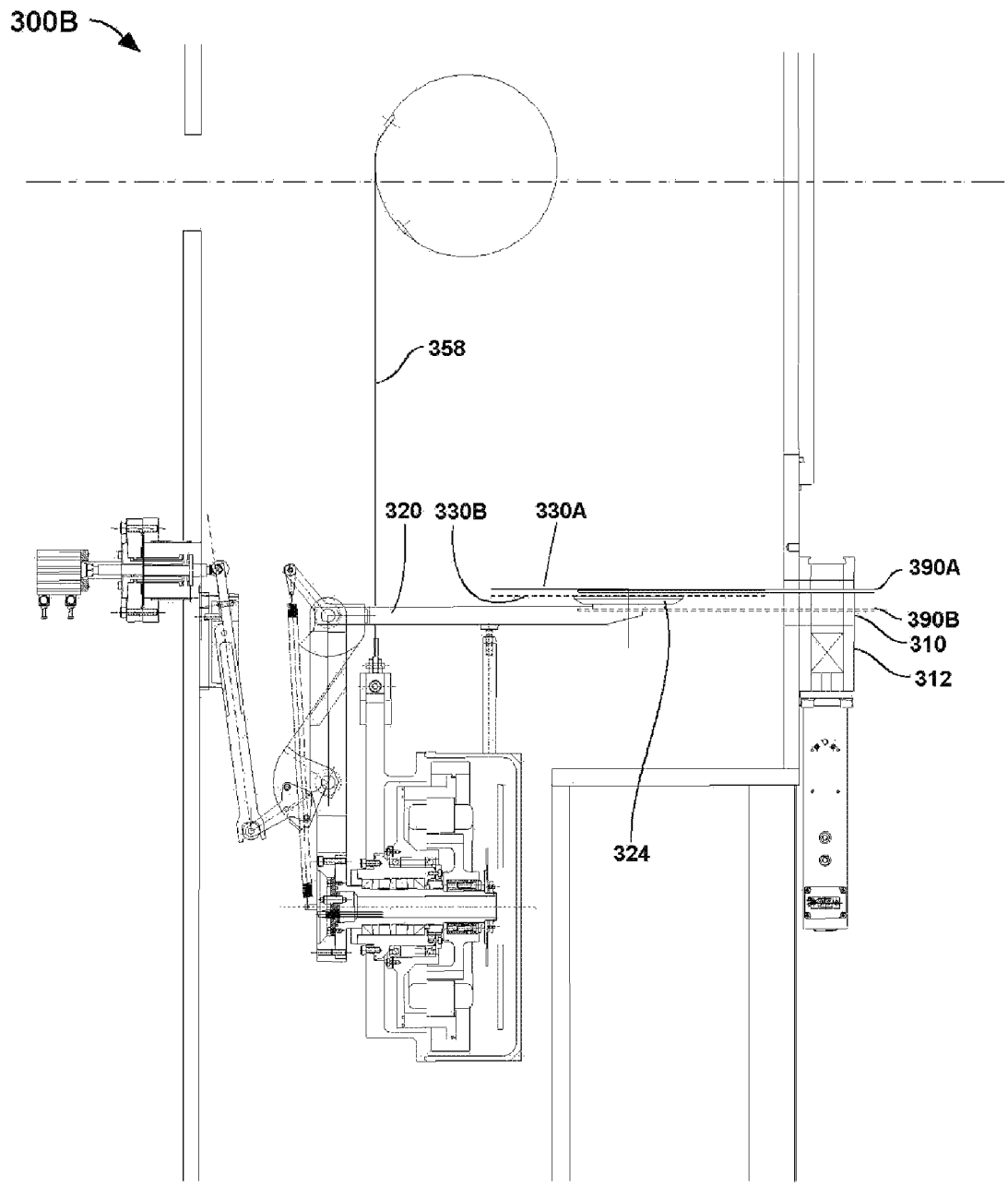
FIG. 6 shows a schematic of a processing chamber 300B of a GCIB processing apparatus utilizing a workpiece scanner according to an embodiment of the present invention, and wherein the workpiece holder of the scanner is shown in a workpiece load/unload position and illustrates some details of the workpiece load/unload process.

FIG. 6 shows a schematic of a processing chamber 300B of a GCIB processing apparatus utilizing a workpiece scanner according to an embodiment of the present invention, wherein the workpiece holder 324 of the scanner is shown in a workpiece load/unload position and illustrates some details of the workpiece load/unload process. The gate valve 312 is open and accordingly the workpiece transfer opening 310 is also open. A workpiece transfer arm 390 is designated 390A at a first position and is designated 390B at a second position. The workpiece transfer arm 390 is part of a robotic or automated workpiece transferring system that operates to move workpieces from the load lock (not shown) outside the processing chamber 302 (FIG. 2) into the processing chamber and onto the wafer holder 324 during workpiece loading (and reversibly for workpiece unloading). The workpiece transfer arm 390 holding a workpiece 330 reaches through the workpiece transfer opening 310 to a first position placing the workpiece above the workpiece holder at a first position where the workpiece is designated by 330A. The workpiece transfer arm 390 then lowers to the second position designated 390B, setting the workpiece 330 onto the workpiece holder 324 at the position where the workpiece is designated 330B. The workpiece holder 324 (preferably an electrostatic chuck) is then actuated to hold the workpiece attached to the workpiece holder 324. Finally, the workpiece transfer arm is withdrawn back through the workpiece transfer opening 310 and the gate valve 312 seals the workpiece transfer opening 310.

Figure 7A:
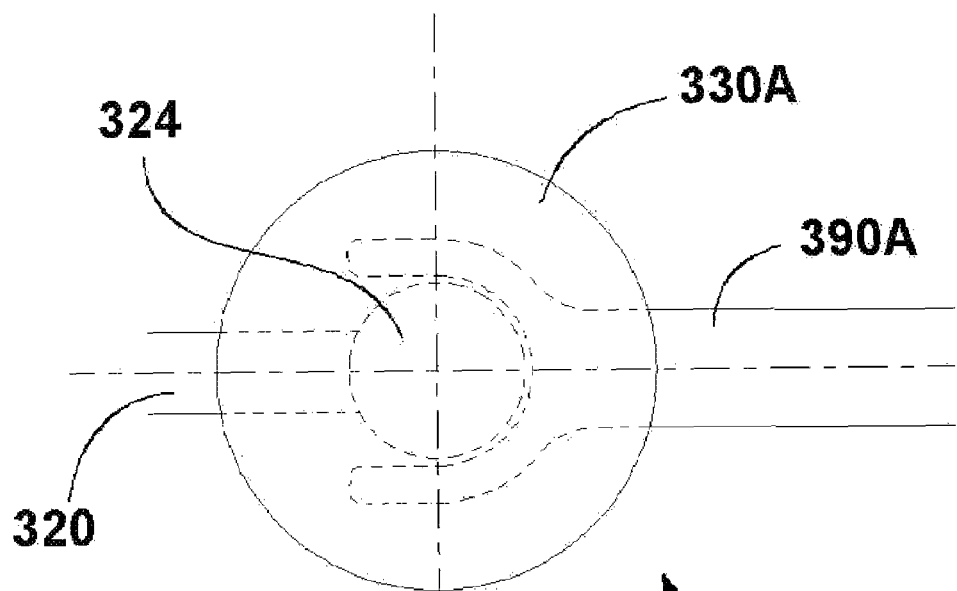
FIGS. 7A and 7B show some details of the loading and unloading process for placing or removing a workpiece from the workpiece holder of the scanner according to an embodiment of the invention.
Figure 7B:
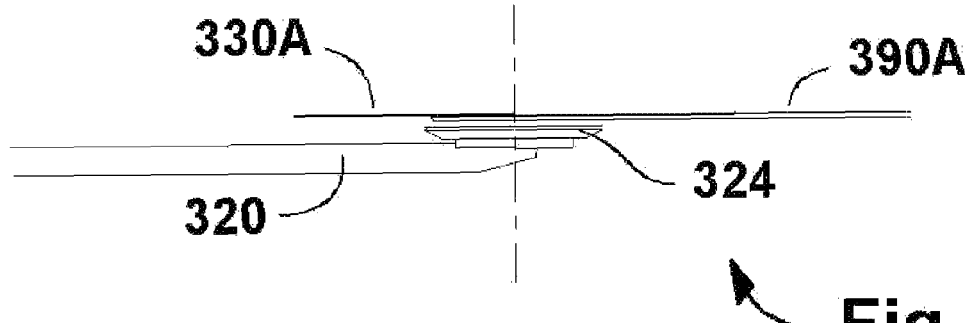
Figure 8:
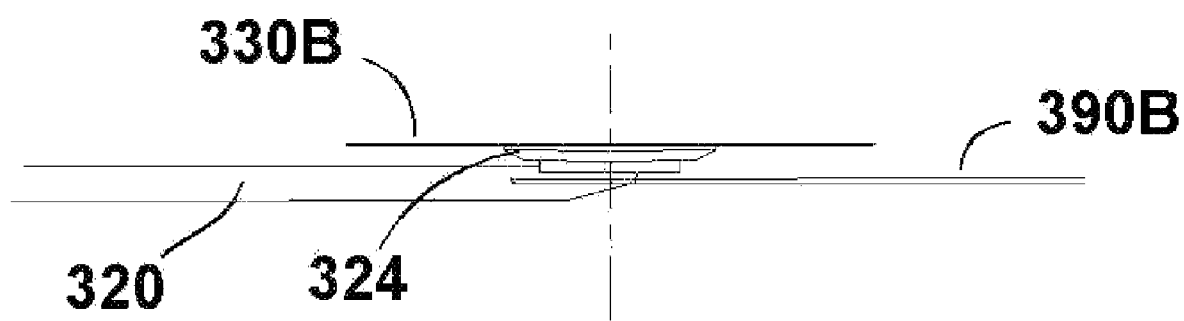
FIG. 8 shows additional details of the loading and unloading process for placing or removing a workpiece from the workpiece holder of the scanner according to an embodiment of the invention.

FIGS. 7A, 7B and 8 show additional details of the loading and unloading process for placing or removing a workpiece 330 from the workpiece holder of the scanner according to an embodiment of the invention. FIG. 7A shows a top of the wafer transfer previously described as the first position in the description of FIG. 6 and FIG. 7B shows a side view. FIG. 8 shows a side view of the wafer transfer previously described as the second position in the description of FIG. 6. FIGS. 6, 7A, 7B and 8 together illustrate the process for loading a workpiece 330 onto the workpiece holder 324. The inverse process is utilized to unload a workpiece from the workpiece holder.

Figure 9:
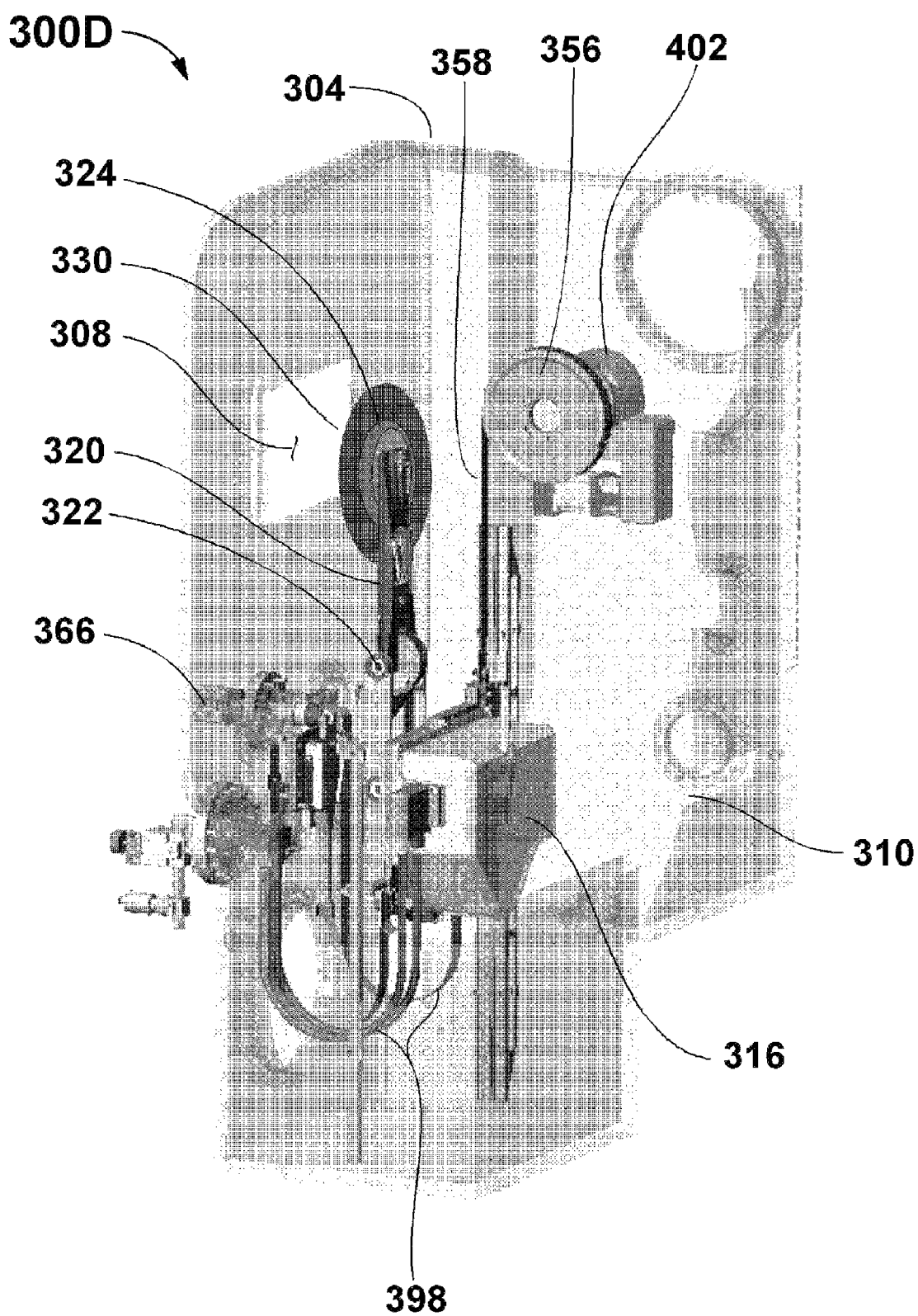
FIG. 9 shows a schematic of a processing chamber 300D of a GCIB processing apparatus utilizing a workpiece scanner according to an embodiment of the present invention.

FIG. 9 shows a schematic of a processing chamber 300D of a GCIB processing apparatus utilizing a workpiece scanner according to an embodiment of the present invention. In addition to structures and functions previously described, FIG. 9 illustrates the flexible cooling, power, and control connections 398 that connect the moving scan motor enclosure 316 to facilities necessary to the operation of the scan motor and the scanning assembly including the workpiece holder.

Figure 10:
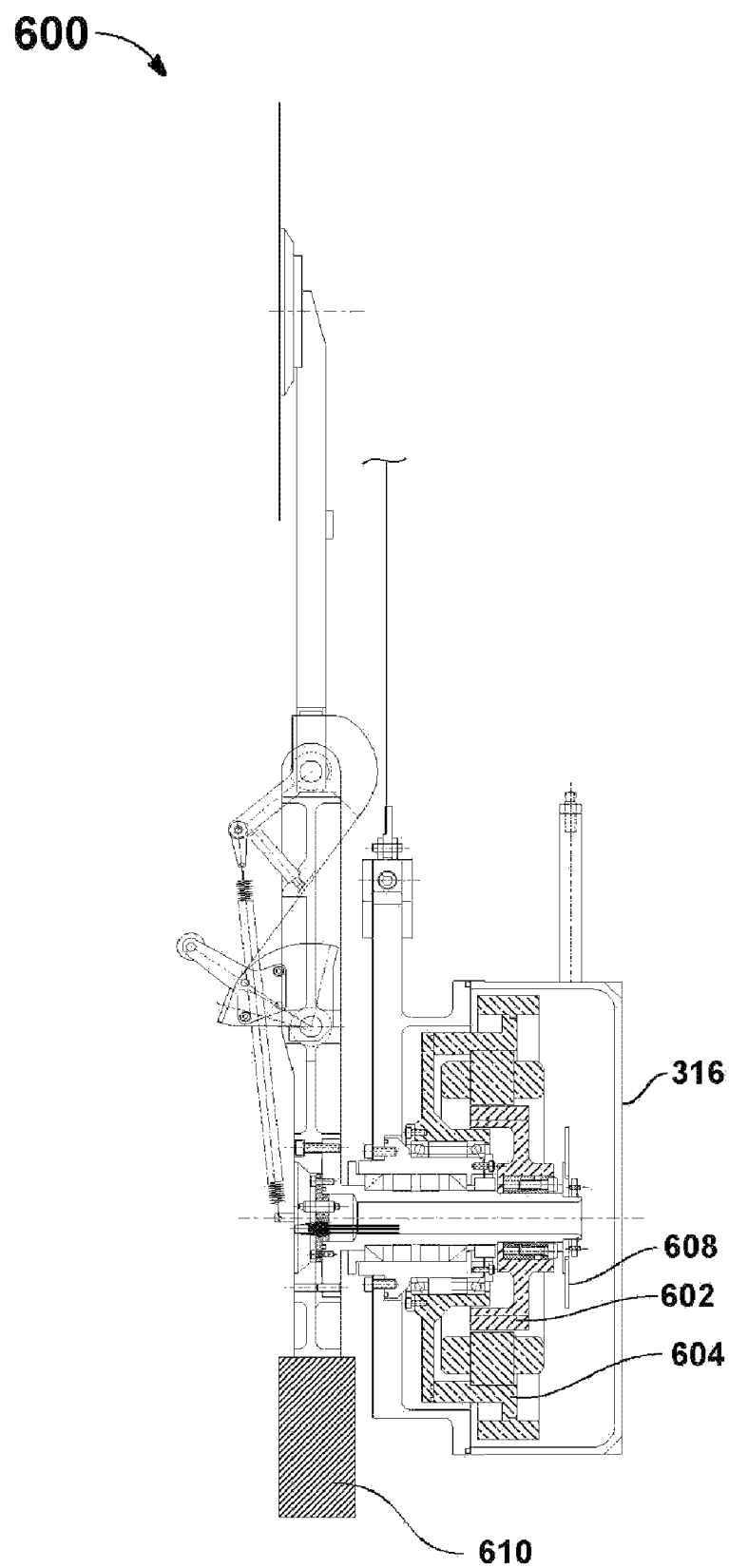
FIG. 10 shows a schematic of a portion of the scanner 600 according to an embodiment of the present invention, and illustrates some motor and counterbalance details.

FIG. 10 shows a schematic of a portion of the scanning assembly 600 according to an embodiment of the present invention, and illustrates some motor and counterbalance details. The rotary scan motor 315 (FIG. 2) comprises a permanent magnet rotor assembly 602 attached to shaft 332 (FIG. 2) and a stator assembly 604. A rotary encoding wheel 608 is attached to the shaft 332 (FIG. 2) to facilitate precise position feedback from the scan motor to facilitate control. The stator assembly 604 is preferably a counter-rotating stator assembly that rotates in reaction to the rotation of the rotor assembly 602, according to principles taught in US 2005/0230643A1, US 2005/0232748A1, and US 2005/0232749A1 (Vanderpot et al.) in order to reduce the vibration and other reaction motion transmitted to the scan motor enclosure 316 and to the scanning assembly supporting structures. Furthermore, the lower scan arm 318 (FIG. 2) has a counterbalance assembly 610 attached to its lower extreme, below the hub 340 (FIG. 2) and opposite the workpiece holder end of the scan arm. This counterbalance assembly 610 is designed according to conventional principles to statically and/or dynamically balance the scan arm assembly, resulting in smoother operation of the rotary arcuate scan motion 504 (FIG. 4).

Although the invention has been described with respect to various embodiments, it should be realized this invention is also capable of a wide variety of further and other embodiments within the spirit of the invention.

What is claimed is:

1. A method for scanning a workpiece through an ion beam path, comprising the steps of:
mounting a workpiece within an ion beam path at one end of an elongated member;
partially, repetitively rotating the elongated member around a point of rotation on the elongated member and away from the workpiece using an electric motor with the elongated member mounted thereto to make repetitive scans of the workpiece through the ion beam path along an arcuate path defining an imaginary plane;
maintaining a partial vacuum within an enclosure located around the elongated member and the electric motor;
bending the elongated member at a joint located between the one end and the point of rotation to move the one end out of the imaginary plane of the arcuate path to facilitate attachment and removal of individual workpieces at the one end, and
moving the elongated member upwardly or downwardly to cause different portions of the workpiece to pass through the ion beam path during the repetitive scans,
wherein the step of moving the elongated member includes suspending the electric motor and elongated member against gravity and thereby raising and lowering the electric motor and elongated member.

2. The method of claim 1, wherein the workpiece is a semiconductor substrate, and further wherein the step of bending the elongated member moves the workpiece to a substantially horizontal position.

3. The method of claim 2, further comprising
attaching and removing individual workpieces at the one end through a closable opening in the enclosure while the elongated member is bent and the workpieces are handled in a substantially horizontal position.

4. The method of claim 1, further comprising the step of guiding the raising and lowering of the suspended electric motor and elongated member within the enclosure.

5. The method of claim 1, wherein the step of partially, repetitively rotating the elongated member uses an electric motor having a rotating stator adapted to act as a reaction mass to a rotor.

6. The method of claim 1, wherein the step of bending includes the steps of:
mechanically biasing the elongated member towards a first position wherein the one end is extended to intersect the ion beam path;
engaging a portion of the elongated member between the one end and the joint; and
alternatively using the step of moving to bend the elongated member against the mechanical biasing during the step of engaging the portion of the elongated member.

7. The method of claim 1, wherein the step of mounting uses an electrostatic chuck for holding a semiconductor workpiece.

8. An apparatus for scanning a workpiece through an ion beam path, comprising:
an elongated member adapted to mount a workpiece within an ion beam path at one end of the elongated member;
a rotational mechanism mounting the elongated member at a point of rotation located on the elongated member away from the one end and further adapted to repetitively scan the one end along an arcuate path defining an imaginary plane by partial repetitive rotation of the rotational mechanism and the elongated member for scanning a workpiece mounted on the one end through the ion beam path;

wherein the elongated member includes a joint located between the one end and the point of rotation and adapted to allow bending of the elongated member to move the one end out of the imaginary plane of the arcuate path to facilitate attachment and removal of individual workpieces at the one end;

an enclosure located around the elongated member and the rotational mechanism and adapted to maintain a partial vacuum therein; and a mechanism suspending the elongated member and rotational mechanism against gravity within the enclosure and adapted to cause linear movement of the rotational mechanism and the elongated member upwardly and downwardly to cause different portions of a workpiece mounted on the one end to pass though the ion beam path during repetitive scans.

9. The apparatus of claim 8, wherein the elongated member is adapted to orient the one end and planar workpieces attached thereto in a substantially horizontal position when the elongated member is bent.

10. The apparatus of claim 9, wherein the enclosure includes a closable opening adapted to facilitate attachment and removal of individual workpieces at the one end of the elongated member in the substantially horizontal position.

11. The apparatus of claim 8, further comprising one or more guiding members affixed within the enclosure and adapted for guiding the raising and lowering of the suspended rotational mechanism.

12. The apparatus of claim 8, wherein the mechanism suspending the elongated member and the rotational mechanism includes a flexible tensile member and a rotatable drum, wherein the flexible tensile member is attached to the rotational mechanism and adapted to wrap around the drum to allow rotation of the drum to raise and lower the rotational mechanism and elongated member.

13. The apparatus of claim 12, further comprising an electric motor positioned outside of the enclosure and adapted to control rotation of the drum.

14. The apparatus of claim 8, wherein the elongated member includes an electrostatic chuck located at the one end and adapted it for mounting the workpiece to the elongated member.

15. The apparatus of claim 8, wherein the rotational mechanism includes an electric motor having a rotating stator adapted to act as a reaction mass to a rotor.

16. An apparatus for scanning a workpiece through an ion beam path, comprising:

an elongated member adapted to mount a workpiece within an ion beam path at one end of the elongated member;

a rotational mechanism mounting the elongated member at a point of rotation located on the elongated member away from the one end and further adapted to repetitively scan the one end along an arcuate path defining an imaginary plane by partial repetitive rotation of the rotational mechanism and the elongated member for scanning a workpiece mounted on the one end through the ion beam path;

wherein the elongated member includes a joint located between the one end and the point of rotation and adapted to allow bending of the elongated member to move the one end out of the imaginary plane of the arcuate path to facilitate attachment and removal of individual workpieces at the one end; and a bias mechanism adapted to bias the elongated member around the joint to an extended position of the one end positioned within the ion beam path; and an engagement mechanism adapted to selectively engage a portion of the elongated member between the one end and the joint, wherein the selectively engageable portion of the elongated member is adapted to cause bending of the elongated member at the joint in response to linear movement of the elongated member when selectively engaged by the engagement mechanism.

17. An apparatus for scanning a workpiece through an ion beam path, comprising:

an elongated member adapted to mount a workpiece within an ion beam path at one end of the elongated member; and a rotational mechanism mounting the elongated member at a point of rotation located on the elongated member away from the one end and further adapted to repetitively scan a workpiece mounted on the one end through the ion beam path along an arcuate path by partial repetitive rotation of the rotational mechanism and the elongated member;

an enclosure located around the elongated member and the rotational mechanism and adapted to maintain a partial vacuum therein; and a mechanism suspending the elongated member and rotational mechanism against gravity within the enclosure and adapted to cause linear movement of the rotational mechanism and the elongated member upwardly and downwardly to cause different portions of a workpiece mounted on the one end to pass through the ion beam path during repetitive scans.

18. The apparatus of claim 17, wherein the rotational mechanism includes an electric motor having a rotating stator adapted to act as a reaction mass to a rotor.

19. The apparatus of claim 17, wherein the mechanism suspending the elongated member and the rotational mechanism includes a flexible tensile member and a rotatable drum, and further wherein the flexible tensile member is attached at opposite ends to the rotational mechanism and to the drum and adapted to wrap around the drum to allow rotation of the drum to raise and lower the rotational mechanism and elongated member.

20. The apparatus of claim 18, further comprising an electric motor positioned outside of the enclosure and adapted to control rotation of the drum.

21. A method for scanning a workpiece through an ion beam path, comprising the steps of:

mounting a workpiece within an ion beam path at one end of an elongated member;

partially, repetitively rotating the elongated member around a point of rotation on the elongated member and away from the workpiece with an electric motor mounting the elongated member to make repetitive scans of the workpiece through the ion beam path along an arcuate path;

maintaining a partial vacuum within an enclosure located around the elongated member and the electric motor; and moving the elongated member upwardly or downwardly to cause different portions of the workpiece to pass through the ion beam path during the repetitive scans, wherein the step of moving the elongated member includes suspending the electric motor and elongated member against gravity and thereby raising and lowering the electric motor and elongated member.

22. The method of claim 21, wherein the step of moving the elongated member includes the step of rotating a drum attached to the electric motor by a flexible tensile member with one end of the flexible tensile member adapted to wrap around the drum with rotation thereof.

23. The method of claim 21, wherein the step of partially, repetitively rotating the elongated member uses an electric motor having a rotating stator adapted to act as a reaction mass to a rotor.

24. The method of claim 1, wherein the step of bending rotates the one end into a second imaginary plane which intersects the first said imaginary plane.

25. The method of claim 8, wherein the joint is adapted to cause bending of the elongated member to rotate the one end out of the first said imaginary plane defined by the arcuate path and into a second imaginary plane which intersects the first said imaginary plane.

* * * * *